United States Patent
Bedeschi et al.

(10) Patent No.: US 7,885,101 B2
(45) Date of Patent: Feb. 8, 2011

(54) METHOD FOR LOW-STRESS MULTILEVEL READING OF PHASE CHANGE MEMORY CELLS AND MULTILEVEL PHASE CHANGE MEMORY

(75) Inventors: Ferdinando Bedeschi, Agrate (IT); Claudio Resta, Pavia (IT); Marco Ferraro, Tricase (IT)

(73) Assignee: Numonyx B.V., Rolle (CH)

( * ) Notice: Subject to any disclaimer, the term of this patent is extended or adjusted under 35 U.S.C. 154(b) by 198 days.

(21) Appl. No.: 12/345,398

(22) Filed: Dec. 29, 2008

(65) Prior Publication Data
US 2010/0165712 A1 Jul. 1, 2010

(51) Int. Cl.
*G11C 11/00* (2006.01)
(52) U.S. Cl. .................. 365/163; 365/148; 365/189.07; 365/189.15
(58) Field of Classification Search .................. 365/163, 365/148, 189.15, 189.07
See application file for complete search history.

(56) References Cited

U.S. PATENT DOCUMENTS 7,515,461 B2 * 4/2009 Happ et al. .................. 365/163

* cited by examiner

*Primary Examiner*—David Lam
(74) *Attorney, Agent, or Firm*—Blakely, Sokoloff, Taylor & Zafman LLP

(57) ABSTRACT

According to a method for multilevel reading of a phase change memory cell a bit line (9) and a PCM cell (2) are first selected and a first bias voltage ($V_{BL}$, $V_{00}$) is applied to the selected bit line (9). A first read current ($I_{RD00}$), that flows through the selected bit line (9) in response to the first bias voltage ($V_{BL}$, $V_{00}$), is compared with a first reference current ($I_{00}$). The first reference current ($I_{00}$) is such that the first read current ($I_{RD00}$) is lower than the first reference current ($I_{00}$), when the selected PCM cell (2) is in a reset state, and is otherwise greater. It is then determined whether the selected PCM cell (2) is in the reset state, based on comparing the first read current ($I_{RD00}$) with the first reference current ($I_{00}$). A second bias voltage ($V_{BL}$, $V_{01}$), greater than the first bias voltage ($V_{BL}$, $V_{00}$), is applied to the selected bit line (9) if the selected PCM cell (2) is not in the reset state.

18 Claims, 6 Drawing Sheets

METHOD FOR LOW-STRESS MULTILEVEL READING OF PHASE CHANGE MEMORY CELLS AND MULTILEVEL PHASE CHANGE MEMORY

BACKGROUND OF THE INVENTION

1) Field of the Invention

Embodiments of the present invention relates to a method for low-stress multilevel reading of phase change memory cells and to a multilevel phase change memory device.

2) Description of Related Art

As is known, phase change memories use a class of materials that have the property of switching between two phases having distinct electrical characteristics, associated with two different crystallographic structures of the material: an amorphous, disorderly phase, and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), also called GST, which is now widely used for storing information on overwritable disks and has been also proposed for mass storage.

In chalcogenides, the resistivity varies by to or more orders of magnitude when the material passes from the amorphous (more resistive) phase to the crystalline (more conductive) phase, and vice versa.

Phase change can be obtained by locally increasing the temperature. Below 150° C., both phases are stable. Starting from an amorphous state, and raising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

Memory devices exploiting the properties of chalcogenic material (also called phase change memory devices) have been already proposed.

The composition of chalcogenides suitable for the use in a phase change memory device and a possible structure of a phase change element is disclosed in a number of documents (see, e.g., U.S. Pat. No. 5,825,046).

As discussed in EP-A-1 326 254 (corresponding to US-A-2003/0185047) a memory element of a phase change memory device comprises a chalcogenic material and a resistive electrode, also called a heater.

In fact, from an electrical point of view, the crystallization temperature and the melting temperature are obtained by causing an electric current to flow through the resistive electrode in contact or close proximity with the chalcogenic material and thus heating the chalcogenic material by Joule effect.

In particular, when the chalcogenic material is in the amorphous, high resistivity state (also called the reset state), it is necessary to apply current pulses of suitable length and amplitude and allow the chalcogenic material to cool slowly. In this condition, the chalcogenic material changes its state and switches from a high resistivity to a low resistivity state. More precisely, crystalline paths of different controlled conductivities may be formed through the chalcogenic memory elements, depending on the duration and the amplitude of the pulses. In practice, average cross sections of crystalline paths may be adjusted by supplying appropriate current profiles. Thus, the resistivity of the phase change material can be repeatably set to one of a plurality of several levels, thereby providing multilevel phase change memories, that may store more than one bit in each cell.

The chalcogenic material may be conversely switched back to the amorphous state by high amplitude current pulses and fast cooling.

Multilevel phase change memories must cope with more and more demanding requirements for scaling, as any other microelectronic device. Scaling, in fact often results in increased disturbances compared to meaningful signal and therefore affects signal-to-noise ratio. For example, in multilevel phase change memories scaling leads to concentrate distributions that correspond to different programming levels, so that margins available to discriminate different levels are reduced. Also, selectors and heaters have greater resistance, that result in smaller output currents for a given reading voltage.

On the other hand, reading voltage must be kept below a safety value and cannot be indefinitely increased. Otherwise, in fact, temperature in the chalcogenide might be raised during reading to such an extent that phase switch occurs. It is also known that chalcogenide memory elements show increasing drift from amorphous to crystalline state, as the reading voltage approaches the safety value. Although single reading operations do not alter data stored in the cells, multiple repetitions may affect long-term capability to retain data and cause errors.

The object of the invention is to provide a method for multilevel reading of phase change memory cells and a multilevel phase change memory device, which are free from the above-described limitations.

According to embodiment of the present invention, methods for multilevel reading of phase change memory cells and a multilevel phase change memory device are provided.

BRIEF DESCRIPTION OF THE DRAWINGS

For the understanding of the present invention, some embodiments thereof will be now described, purely as non-limitative examples, with reference to the enclosed drawings, wherein:

FIG. 1 shows a phase change memory ("PCM" hereinafter) device 1. A plurality of PCM cells 2 are arranged in rows and columns to form an array 3. A row decoder 4 and a column decoder 5 are coupled to a memory control unit 6 and to a read/program unit 7, which includes a program circuit 7a and a read/verify circuit 7b. Word lines 8 and bit lines 9 run parallel to rows and columns, respectively, and are selectively connectable to the read/program unit 7 through the row decoder 4 and the column decoder 5, in a known manner. In particular, the column decoder 5 is coupled to the read/verify circuit 7b over as many read lines 7c as the number of bit lines 9 that may be simultaneously selected for reading.

Figure 1:
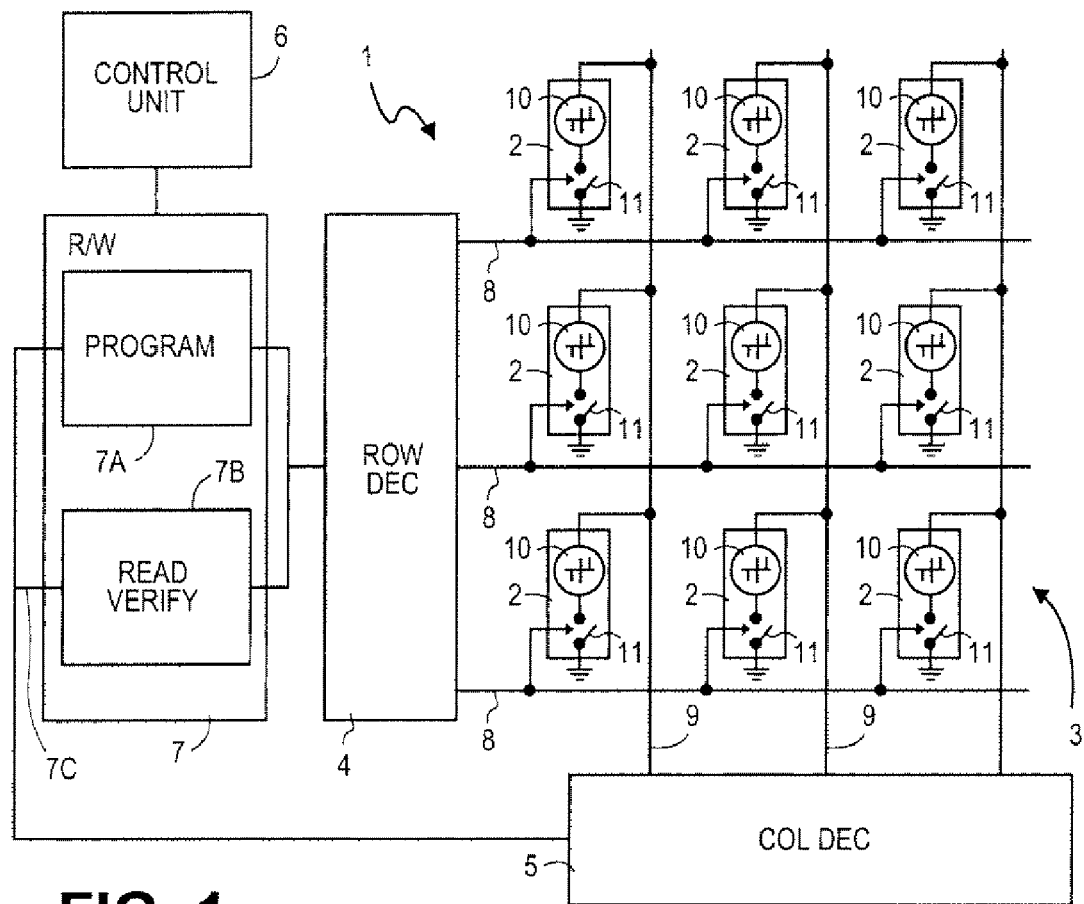
FIG. 1 is a simplified block diagram of a phase change memory device according to one embodiment of the present invention.

Each PCM cell 2 is connected at a cross-point of a respective word line 8 and a respective bit line 9 and includes a storage element 10, of the phase change type, and a selection element 11. The storage element 10 has a first terminal connected to the respective bit line 9 and a second terminal connected to a first terminal of the selection element 11. The selection element 11 has a second terminal grounded and a control terminal connected to the respective word line 8 According to alternative solutions, the storage element 10 and the selection element 11 of each PCM cell 2 may be exchanged in position; moreover, the selection elements 11 may have two terminals only (e.g. diodes).

The program circuit 7a is configured to provide programming currents $I_P$ to program selected PCM cells 2 selectively into one of a plurality of states, under control of the memory control unit 6. The number of available states will be indicated as N. In the embodiment herein described, PCM cells 2 may store two bits each, so they have N=4 states, namely a reset state or most resistive state (00, in which substantially all the phase change material forming the storage element is amorphous, without crystalline through paths), one set state or least resistive state (11, in which substantially all the phase change material forming the storage element is crystalline), and two intermediate crystalline states or intermediate resistive states (01 and 10, having respective intermediate resistances).

Figure 2:
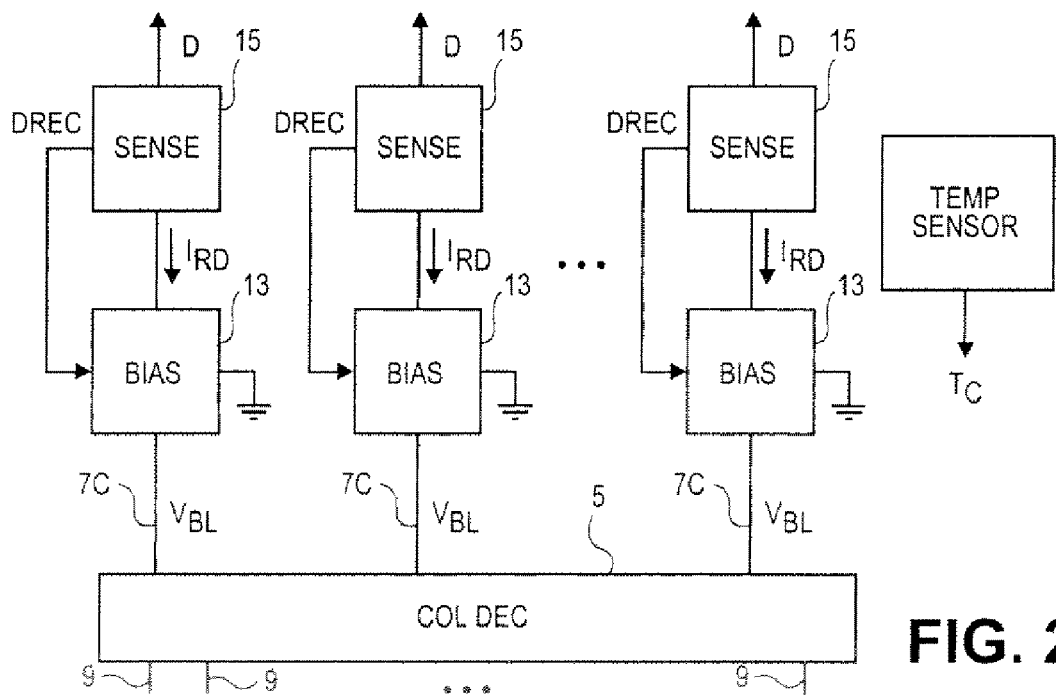
FIG. 2 is a more detailed block diagram of a portion of the phase change memory device of FIG. 1.

As shown in FIG. 2, the read/verify circuit 7b includes a plurality of bit line bias circuits 13, sense circuits 15 and a temperature sensor 16. Namely, there are one respective bit line bias circuit 13 and one respective sense circuit 1 for each read line 7c (hence, for each bit line 9 selected for reading).

The bias circuits 13 are coupled to a respective sense circuit 15 and to a respective read line 7c. The bias circuits 13 are operable to supply bias voltages, here generally indicated by $V_{BL}$, to selected bit lines 9 through the read lines 7c during reading operation (voltage drop on the column decoder 5 is considered negligible for simplicity). Values for the bias voltages $V_{BL}$ are adjusted based on a temperature signal $T_C$, that is supplied by the temperature sensor 16 and is indicative of an operative temperature of a chip accommodating the PCM device 1.

When the bias voltages $V_{BL}$ are applied to the selected bit lines 9 through the read lines 7c, read currents, here generally designated by $I_{RD}$, flow through the selected bit lines 9 and PCM cells 2.

Sense circuits 15 sense the read currents $I_{RD}$, that depend on actual programming state of respective selected PCM cells 2. Based on comparison with a set of N-1 reference currents, sense circuits 15 determine an actual programming state of respective selected PCM cells 2 and provide corresponding read data D on respective data outputs 15a. When the actual programming state of a selected PCM cells 2 has been determined, the corresponding sense circuit 15 accordingly notifies the respective bias circuit 13 by a data recognition signal DREC. The bias circuit 13 then deselects the corresponding bit line 9 in response to the data recognition signal DREC, so that reading operation may continue without affecting the corresponding PCM cell 2. In one embodiment, the selected bit line 9 may be set to a rest voltage, e.g. ground voltage.

Figure 3:
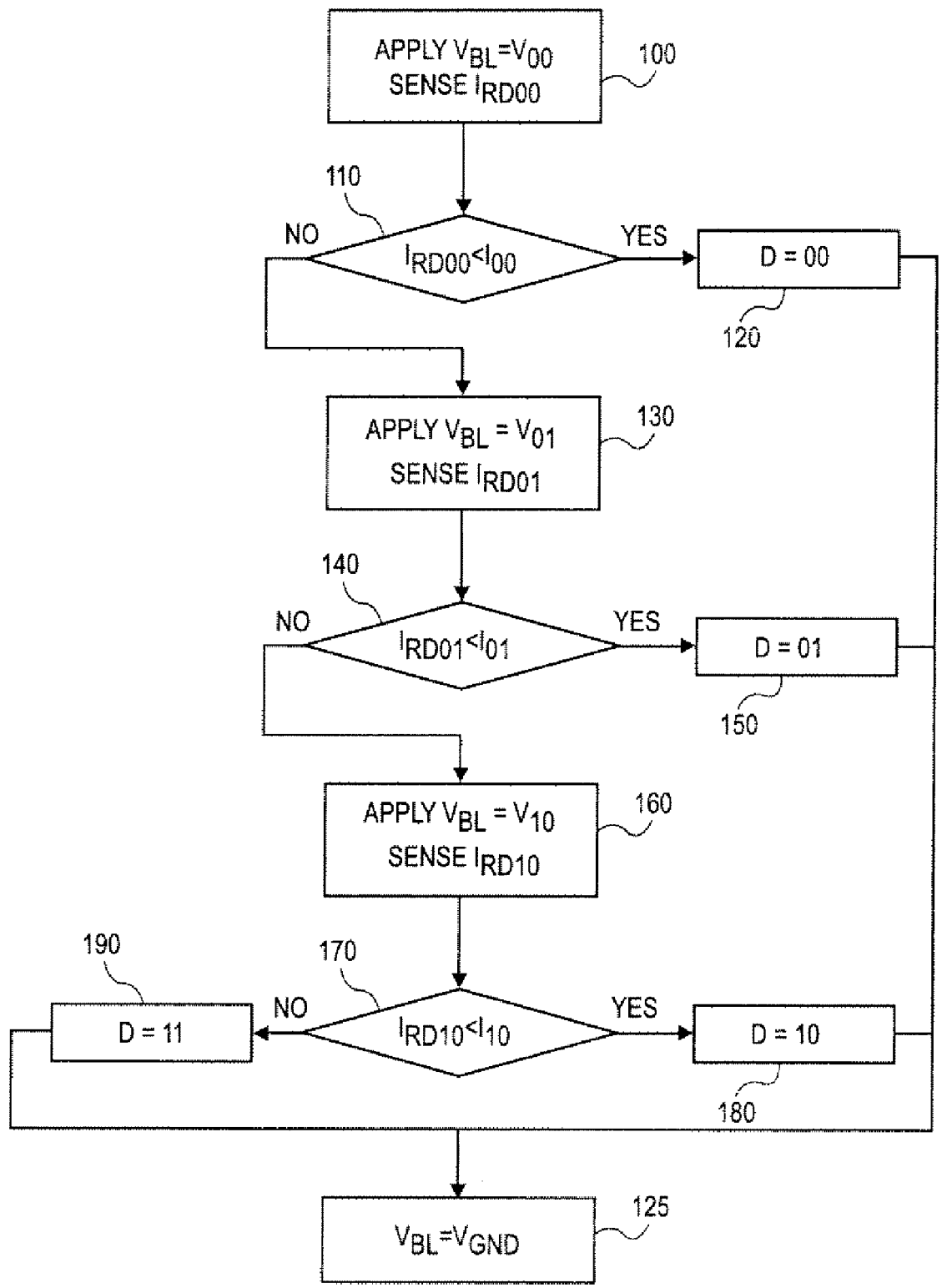
FIG. 3 is a flow chart of a method according to one embodiment of the present embodiment.
Figure 4A:
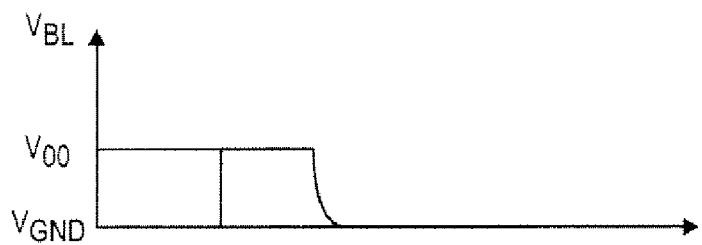
FIGS. 4a-4c are graphs showing first quantities relating to the phase change memory device of FIG. 1.
Figure 4B:
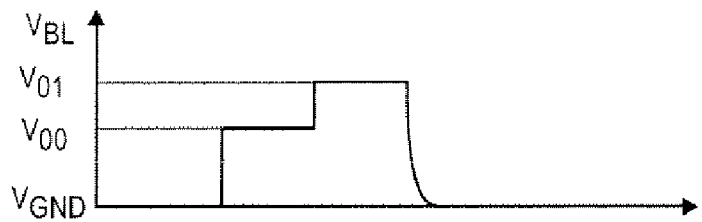
Figure 4C:
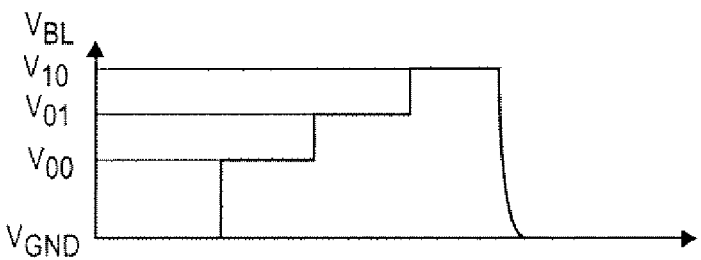

Operation of the PCM device 1 will be now explained in greater detail, with reference to FIGS. 3 and 4a-4c. In particular, FIG. 3 shows a flow chart relating to reading of one of the selected PCM cell 2. The same procedure is applied to all selected PCM cells 2.

Preliminarily, a number of PCM cells 2 are selected for reading, by properly addressing the row decoder 4 and the column decoder 5. Selected bit lines 9, that are connected to selected PCM cells 2, are coupled to respective bias circuits 13 and sense circuits 15 over read lines 7c.

Then (block 100), the temperature signal $T_C$ is read and values for the bias voltages are adjusted accordingly. As will be explained hereinafter bias voltages may assume N-1 voltage levels to discriminate respective programming states (N being the number of storage levels associated to each PCM cell 2). All the N-1 levels are adjusted by shifts opposite to temperature variations. Namely, positive temperature variations are compensated by a negative shift of all the N-1 levels and, vice versa, negative temperature variations are compensated by a positive shift of all the N-1 levels.

Bias circuits 13 then apply a first bias voltage $V_{00}$ to respective selected bit lines 9 (i.e. the bias voltage on the selected bit lines 9 is equal to the first bias voltage $V_{00}$ at this stage $V_{BL}=V_{00}$; block 105). The first bias voltage $V_{00}$ is a relatively low voltage comparable with bit line read bias voltages of conventional PCM devices (e.g. such that a voltage of about 350 mV is applied to the storage element 10).

In any case, the first bias voltage $V_{00}$ is such that virtually no current flows through selected PCM cells 2 that are in the reset state (fully amorphous, most resistive).

Sense circuits 15 sense first read currents $I_{RD00}$ flowing through selected PCM cells 2 in response to the first bias voltage $V_{00}$ being applied to selected bit lines 9. At this stage, read currents $I_{RD00}$ are given by $I_{RD00}=V_{00}/R_{CELL}$, with the cell resistance $R_{CELL}$ of reset PCM cells 2 being around e.g. 100 kΩ (the resistance of the selection element 11 being negligible).

Figure 5A:
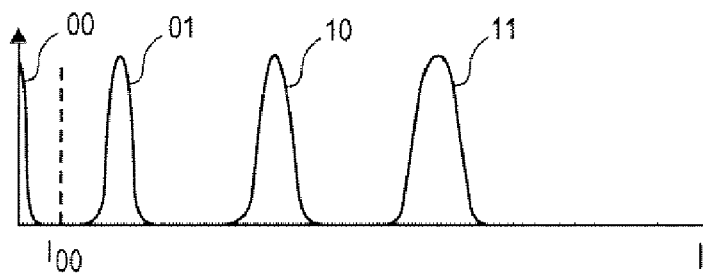
FIGS. 5a-5c are graphs showing second quantities relating to the phase change memory device of FIG. 1.

Sensed first read currents $I_{RD00}$ are then compared with a first reference current $I_{00}$ (block 110, see also figure 5a), such that PCM cells 2 which are in the reset state may be discriminated from PCM cells 2 which are not in the reset state (see also FIG. 5a). Namely, PCM cells which are in the reset state draw virtually no current and, in any case a first read current $I_{RD00}$ lower than the first reference current $I_{00}$. So, if a first read current $I_{RD00}$ is lower than the first reference current $I_{00}$ (block 110, output YES), it is determined that the corresponding PCM cell 2 is in the reset state, read data D="00" is presented on data outputs 15a of sense circuits 15 coupled to PCM cells 2 in the reset state (block 120). PCM cells in the reset state, which have been read, are deselected by connecting the respective bit line 9 to the rest voltage (ground, block 125). Thus, deselected PCM cells will not be affected by bias voltages applied later to still selected PCM cells.

If the first read current $I_{RD00}$ is greater than the first reference current $I_{00}$ (block 110, output NO), the corresponding PCM cell 2 remains selected.

Figure 5B:
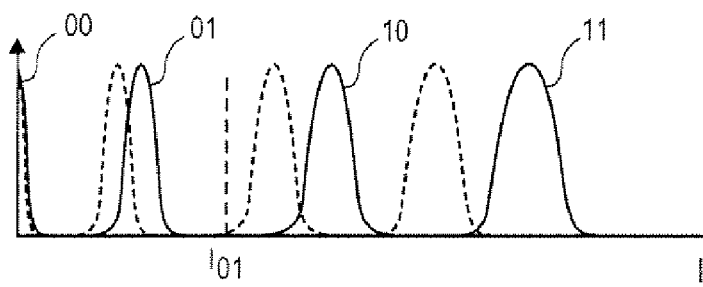

Then (block 130), the bias circuits 13 apply a second bias voltage $V_{01}$ to still selected cells. The second bias voltage $V_{01}$ is greater than the first bias voltage $V_{00}$. Thus, current levels associated to different programming states are separated by wider intervals than in case the first bias voltage $V_{00}$ is applied. This may be appreciated from FIG. 5b, where level distributions for $V_{BL}=V_{00}$ is illustrated by a dashed line.

Second read currents $I_{RD01}$ are again sensed by the sense circuits 15 and compared with a second reference current $I_{01}$, that is such as to discriminate selected PCM cells 2 in the first intermediate crystalline state from those which are in the second intermediate crystalline cells or in the set fully crystalline state (fully crystalline, least resistive).

If a sensed second read current $I_{RD01}$ is lower than the second reference current $I_{01}$ (block 140, output YES), it is determined that the corresponding PCM cell 2 is in the first intermediate crystalline state, read data D="01," is presented on data outputs 15a of sense circuits 15 coupled to PCM cells 2 in the first intermediate crystalline state (block 150), which are deselected (block 125).

If the second read current $I_{RD01}$ is greater than the second reference current $I_{01}$ (block 140, output NO), the corresponding PCM cell remains selected.

Figure 5C:
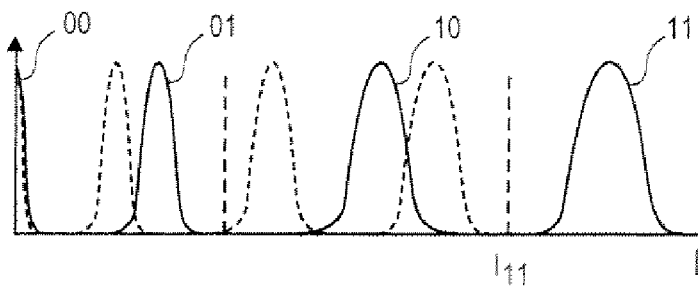

A third bias voltage $V_{10}$ is then applied by the bias circuits 13 to still selected PCM cells 2 and third read currents $I_{RD10}$ thereby generated are sensed by sense circuits 15 Clock 160). As also illustrated in FIG. 5c, sensed third read currents $I_{RD10}$ are then compared with a third reference current $I_{10}$, that is such as to discriminate PCM cells 2 that are in the second intermediate crystalline state ("10") from those in the set state ("11")

If a third read current $I_{RD10}$ is lower than the third reference current $I_{10}$ (block 170, output YES), it is determined that the corresponding 11CM cell 2 is in the first intermediate crystalline state and read data D="10" is presented on data outputs 15a of sense circuits 15 coupled to PCM cells 2 in the first intermediate crystalline state (block 180), which are deselected (block 125). Otherwise, it is determined that the corresponding PCM cell 2 is in the set and read data D="11" is presented on data outputs 15a of sense circuits 15 coupled to PCM cells 2 in the first intermediate crystalline state, which are deselected (block 125).

Thus, all PCM cells 2 initially selected have been read. In practice, a low bias voltage (first bias voltage $V_{00}$) is initially applied exclusively to discriminate PCM cells 2 that are in the reset (fully amorphous) state. Therefore, virtually no current or at least extremely low read currents flow through reset PCM cells 2 and drift effects caused by reading are eliminated.

Then, read cycles are iterated by applying increased bias voltages until the programming state of all the PCM cells 2 has been identified (N−1 times with N available programming states). More precisely, iteration continues until one of the following conditions is met for each selected PCM cell 2:

determination has been made that the selected PCM cell 2 is in one of the intermediate crystalline states 01, 10; and determination has been made that the selected PCM cell (2) is not in any of the further intermediate crystalline states 01, 10.

Moreover, it is determined that the selected PCM cell 2 is in the set state if determination has been made that the selected PCM cell 2 is not in any of the intermediate crystalline states 01, 10.

Selected PCM cell 2 (and the corresponding bit lines 9) for which an actual programming state of the respective has been determined are at any time deselected. In particular, reset PC cells 2 are deselected after applying the lowest available bias voltage, i.e. first bias voltage $V_{00}$. For this reason, reset PC cells 2 are not affected by continuation of reading operations and by higher bias voltages. On the other hand, in PCM cells 2 set to an intermediate crystalline state or to the set state (fully crystalline), read currents are essentially drawn by crystalline paths through the storage element. Instead, possible amorphous material that surrounds the crystalline paths is crossed only by a negligible fraction of the read current and is not substantially affected. Thus, there is no risk of drift and, at the same time, the discrimination of actual programming state is improved, because level distributions are spaced apart from one another as result of the described method. Moreover, the highest bias voltages are only applied to the most conductive PCM cells 2, i.e. those having the most conductive crystalline paths. Therefore, the amorphous material is always preserved. In fact, the higher is the conductivity of the crystalline path, the smaller is the fraction of the read current that crosses the amorphous material. Hence, the read voltage may be increased without significantly altering the state of the storage material as stress on amorphous portions is in any case reduced.

Figure 6:
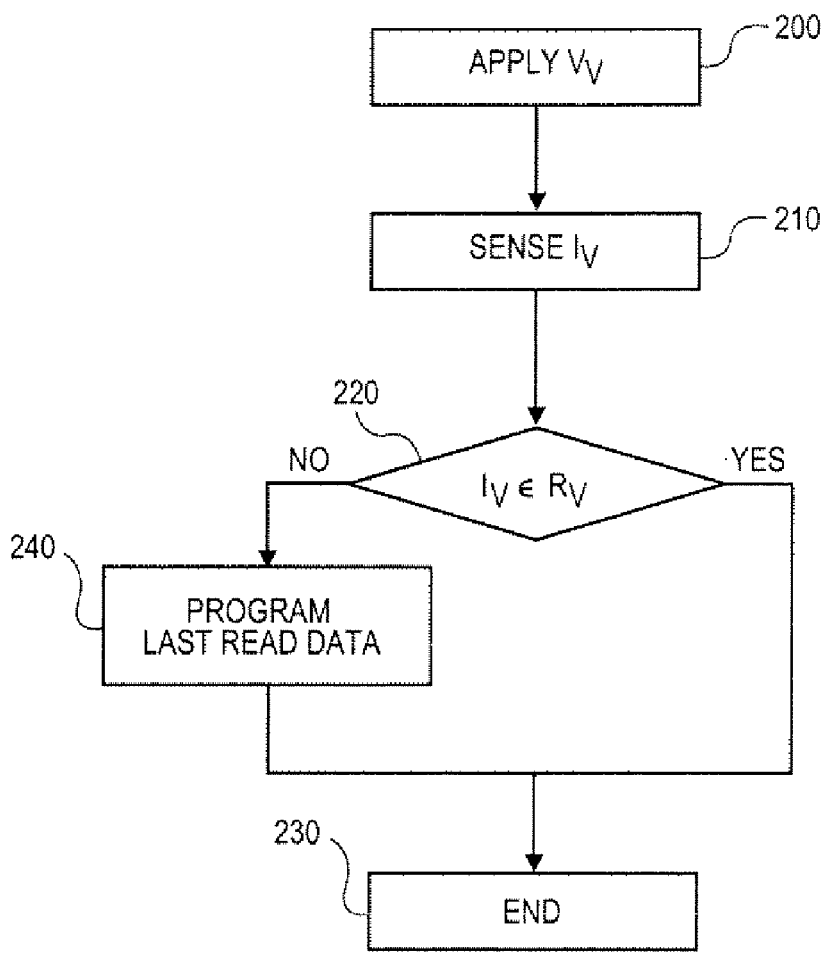
FIG. 6 is a flow chart of a method according to one embodiment of the present embodiment.

In one embodiment, a verify procedure of the read PCM cells 2 is carried out after reading, as illustrated in FIG. 6. Verify bias voltages $V_V$ are applied to bit lines 9, according to data just read from PCM cells 2 are read again (block 200). In practice, for each PCM cell 2 the same bias voltage $V_{BL}$ is used at which recognition of the programming level has occurred (for example, the second bias voltage $V_{01}$ is applied to all PCM cells just read and set to the first intermediate crystalline state 01). Different bias voltages $V_{BL}$ may be simultaneously applied to respective different PCM cells 2. In another embodiment, a single verify bias voltage $V_V$ is applied to all selected PCM cells 2.

Figure 7:
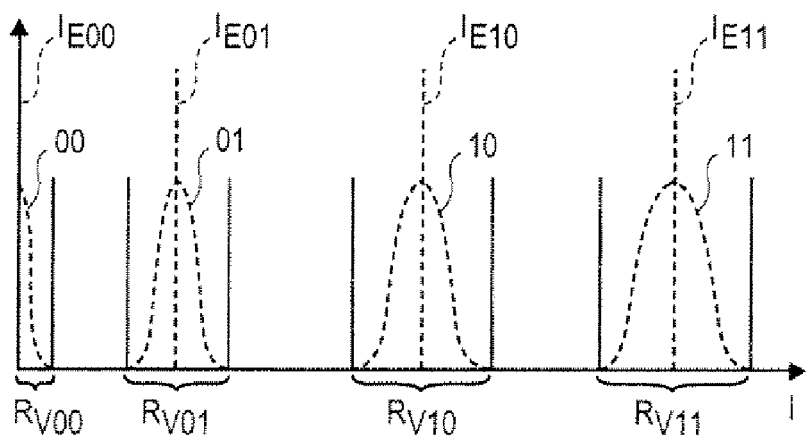
FIG. 7 is a graph showing third quantities relating to the phase change memory device of FIG. 1.

Then, verify currents $I_V$, flowing through bit lines 9 and PCM cells 2 in response to verify bias voltage $V_V$ are sensed by the sense circuits 15 (block 210) and compared to respective verify current ranges $R_V$ (block 220). As illustrated in FIG. 7, verify current ranges $R_V$ include respective current expected values $I_{E00}$, $I_{E01}$, $I_{E10}$, $I_{E11}$.

If the verify currents $I_V$ fall within the respective verify current ranges $R_V$, the verify procedure (block 220, output YES), the procedure is terminated (block 230). Those PCM cells 2 which exhibit verify currents $I_V$ outside the respective verify current ranges $R_V$ (block 220, output NO), the data just read are re-programmed (block 240). Thus, distribution levels of the PCM memory device 1 are kept consistent and possible minor drift effects caused by reading are immediately recovered.

Figure 8:
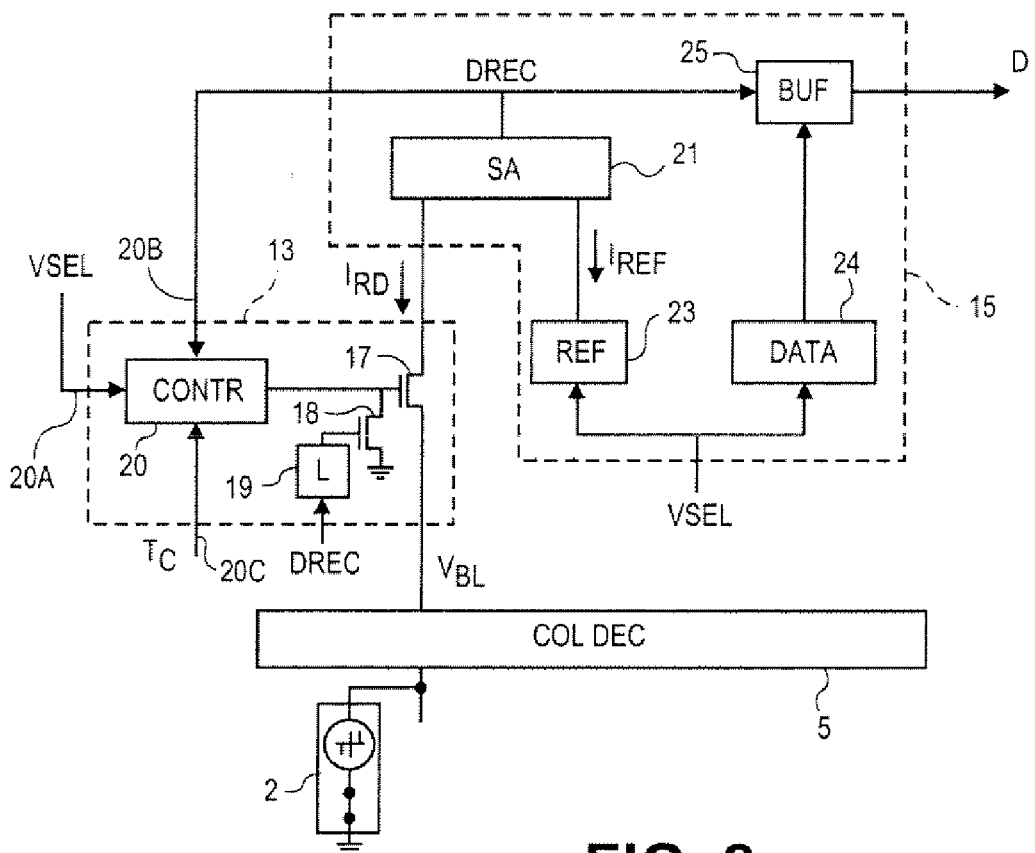
FIG. 8 is detailed block diagram of a particular of the phase change memory device of FIG. 1.

FIG. 8 shows in greater detail one of the bias circuits 13 and one of the sense circuits 15. The bias circuit 13 comprises a regulator transistor 17, having drain and source terminals coupled to the supply line 16 and to the respective read line 7c, and a voltage control circuit 20, that supplies a control voltage to a control terminal of the regulator transistor 17. The voltage control circuit 20 has also a voltage selection input 20a, coupled to the memory control unit 6 for receiving a voltage select signal VSEL, a deselect input 20b, coupled to the sense circuit 15, and an adjust input 20c, coupled to the temperature sensor 16 for receiving the temperature signal $T_C$. The bias circuit 13 further comprises a deselection transistor 18 and a logic circuit 19 controlled by the data recognition signal DREC. The deselection transistor 18, here a NMOS transistor, has drain and source terminals respectively coupled to the gate terminal of the regulator transistor 17 and to ground. One output of the logic circuit 19 is coupled to the gate terminal of the deselection transistor 18. The logic circuit 19 is configured such that the deselection transistor 18 is off at the start of a reading operation. When the data stored in the corresponding PCM cell 2 has been recognized, the data recognition signal DREC switches and, in response, the logic circuit 19 turns on the deselection transistor 18, thereby turning off the regulator transistor 17 and bringing the corresponding selected bit line 9 to ground voltage. The bit line 9 is thus deselected and so remains until the end of the reading operation.

Figure 9A:
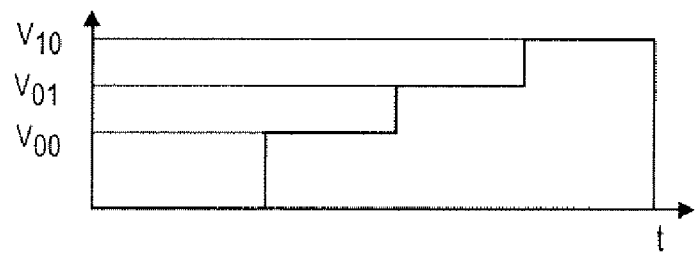
FIGS. 9a-9c are graphs showing second quantities relating to the phase change memory device of FIG. 1.
Figure 9B:
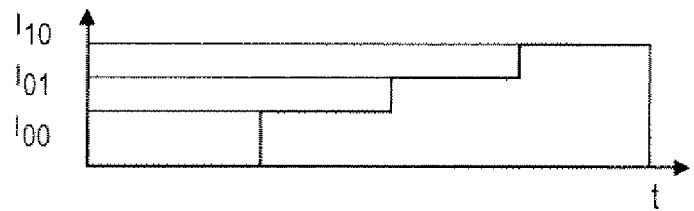
Figure 9C:
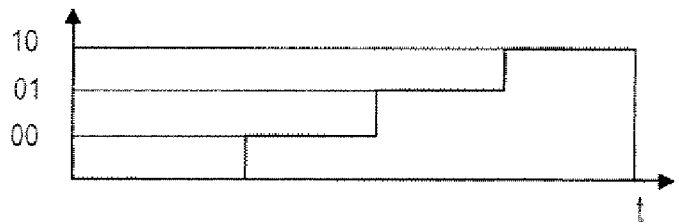

The sense circuit 15 comprises a sense amplifier 21, a reference module 23, that selectively supplies one of the first, second and third reference currents $I_{00}$, $I_{01}$, $I_{10}$ (herein generally designated as reference currents $I_{REF}$, for clarity), a data module 24 and an output buffer 25. The sense amplifier 21 has a sense input 21a, coupled to the read line 7c for sensing the read current $I_{RD}$ when a bias voltage $V_{BL}$ is applied, and a reference input 21b, coupled to the reference module for receiving the reference currents $I_{REF}$. One output of the sense amplifier 21 is coupled to the output buffer 25 for supplying the data recognition signal DREC, in response to the sensed read current $I_{RD}$ being lower than the actual reference current $I_{REF}$. The output of the sense amplifier 21 is also connected to the deselect input 20b of the voltage control circuit 20. The data module 24 is controlled to provide output data values to the output buffer 25 in accordance with currently selected bias voltage $V_{BL}$ and reference current $I_{REF}$, as illustrated in the diagram of FIGS. 9a-9c. In the embodiment herein described, both the reference module 23 and the data module 24 are controlled by the memory control unit 6 through the voltage select signal VSEL.

In reading operations, the memory control unit 6 selects appropriate bias voltages $V_{BL}$ to be applied to selected bit lines 9 through the voltage select signal VSEL, as already described. The voltage control circuit 20 drives the regulator transistor 17 so that the selected bias voltage $V_{BL}$ is actually applied to the corresponding bit line 9. At the same time, appropriate reference currents $I_{REF}$ and output data values are selected by the reference module 23 and the data module 24, in accordance with the voltage select signal VSEL, as illustrated in FIGS. 9a-9c. The sense amplifier 21 compares actual read current $I_{RD}$ and reference current $I_{REF}$. If the read current $I_{RD}$ is lower, actual programming state of the corresponding selected PCM cell 2 is determined and sense amplifier 21 sends the data recognition signal DREC. In response to the data recognition signal DREC, the voltage control circuit 20 deselects the corresponding PCM cell 2 by turning off the regulation transistor 17. Thus, the PCM cell 2 is no longer affected by possibly continuing the reading operation and, namely, does not experience higher bias voltages $V_{BL}$ that may alter its programming state. Moreover, the output data value presented by the data module 24 is loaded in the output buffer 25 and supplied as output data D. In case the selected PCM cell 2 is in the set state (i.e. the read current $I_{RD}$ never exceeds any reference current $I_{REF}$), the data value "11" is presented as he output data D. In one embodiment, this is achieved by preloading the data value "11" in the output buffer 25 at the start of the reading operation.

Figure 10:
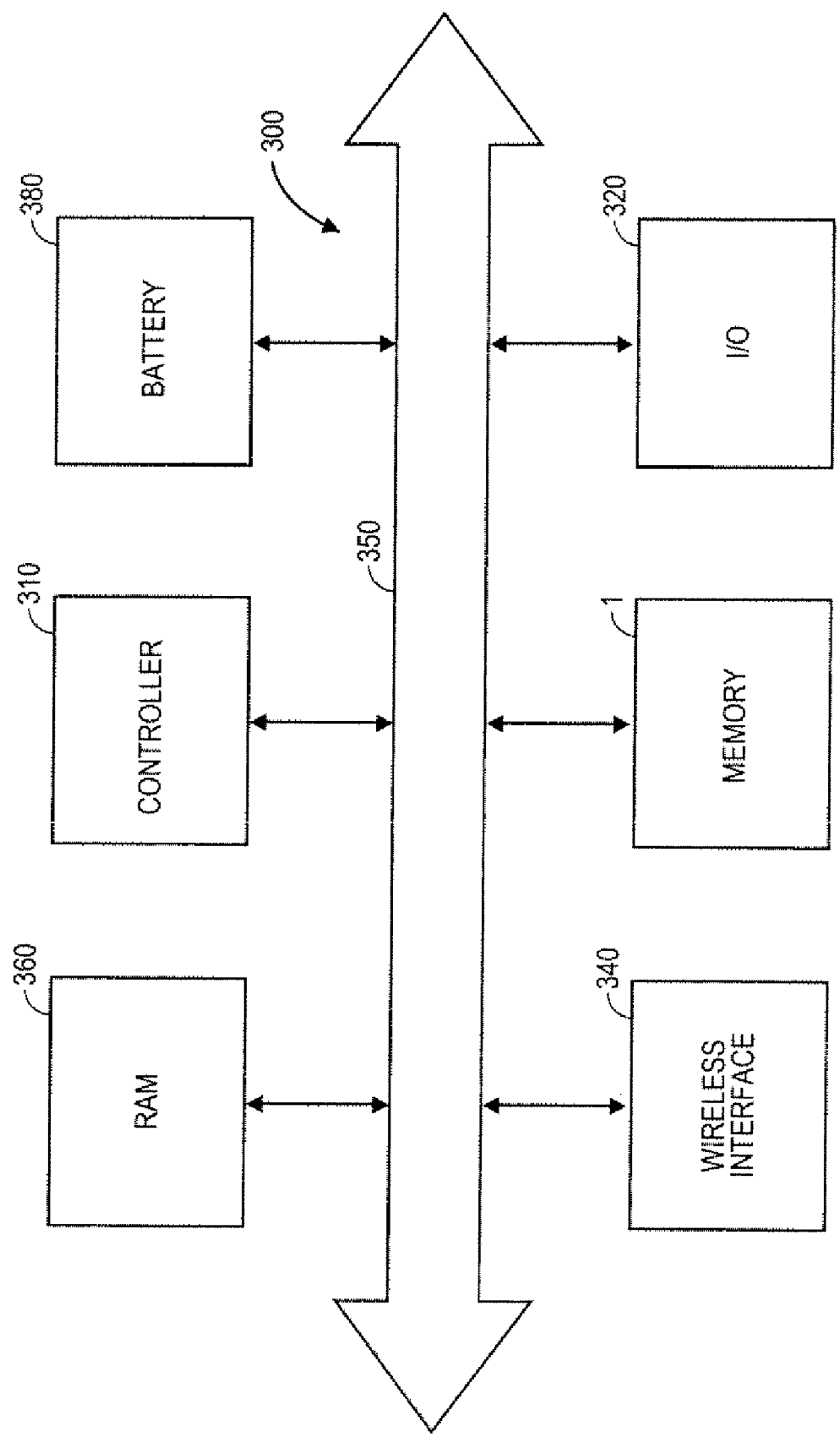
FIG. 10 is a system depiction of one embodiment of the present invention.

In FIG. 10, a portion of a system 300 in accordance with an embodiment of the present invention is illustrated. System 300 may be used in devices such as, for example, a personal digital assistant (PDA), a laptop or portable computer, possibly with wireless capability, a cell phone, a messaging device, a digital music player, a digital camera, or other devices that may be adapted to process, store, transmit or receive information and require permanent storage capability.

System 300 may include a controller 310, an input/output (I/O) device 320 (e.g. a keyboard, display), the phase-change memory device 1, a wireless interface 340, and a RAM memory 360, coupled to each other via a bus 350. A battery 380 may be used to supply power to the system 300 in one embodiment. It should be noted that the scope of the present invention is not limited to embodiments having necessarily any or all of above listed components.

Controller 310 may comprise, for example, one or more microprocessors, digital signal processors, micro-controllers, or the like.

The I/O device 320 may be used to generate a message. The system 300 may use the wireless interface 340 to transmit and receive messages to and from a wireless communication network with a radio frequency (RF) signal. Examples of the wireless interface 340 may include an antenna, or a wireless transceiver, such as a dipole antenna, although the scope of the present invention is not limited in this respect. Also, the I/O device 320 may deliver a voltage reflecting what is stored as either a digital output (if digital information was stored), or as analog information (if analog information was stored).

Finally, it is clear that numerous modifications and variations may be made to the method and the device described and illustrated herein, all falling within the scope of the invention, as defined in the attached claims.

The invention claimed is:

1. A method for multilevel reading of a phase change memory cell, comprising:
    selecting a bit line and a PCM cell coupled to the selected bit line;
    applying a first bias voltage ($V_{BL}$, $V_{00}$) to the selected bit line;
    comparing a first read current ($I_{RD00}$), that flows through the selected bit line in response to the first bias voltage ($V_{BL}$, $V_{00}$), with a first reference current ($I_{00}$), wherein the first reference current ($I_{00}$) is such that the first read current ($I_{RD00}$) is in a first relationship with the first reference current ($I_{00}$), when the selected PCM cell is in a reset state, and the first read current ($I_{RD00}$) is in a second relationship with the first reference current ($I_{00}$) otherwise;
    determining whether the selected PCM cell is in the reset state, based on comparing the first read current ($I_{RD00}$) with the first reference current ($I_{00}$);
    characterized by applying a second bias voltage ($V_{BL}$, $V_{01}$) to the selected bit line if the selected PCM cell is not in the reset state, the second bias voltage ($V_{BL}$, $V_{01}$) being greater than the first bias voltage ($V_{BL}$, $V_{00}$).

2. A method according to claim 1, comprising comparing a second read current ($I_{RD01}$), that flows through the selected bit line in response to applying the second bias voltage ($V_{BL}$, $V_{01}$), with a second reference current ($I_{01}$), wherein the second reference current ($I_{01}$) is such that the second read current ($I_{RD01}$) is in a first relationship with the second reference current ($I_{01}$), when the selected PCM cell is in a first intermediate crystalline state, and the second read current ($I_{RD01}$) is in a second relationship with the second reference current ($I_{01}$) otherwise; and
    determining whether the selected PCM cell is in the first intermediate crystalline state, based on comparing the second read current ($I_{RD01}$) with the second reference current ($I_{01}$).

3. A method according to claim 2, comprising applying a further bias voltage ($V_{BL}$, $V_{10}$) to the selected bit line (9) if a programming state of the selected PCM cell has not been determined yet, the further bias voltage ($V_{BL}$, $V_{10}$) being greater than any bias voltage ($V_{BL}$, $V_{00}$, $V_{01}$) previously applied to the selected bit line;
    comparing a further read current ($I_{RD10}$), that flows through the selected bit line in response to applying the further bias voltage ($V_{BL}$, $V_{10}$), with a further reference current ($I_{10}$), wherein the further reference current ($I_{10}$) is such that the further read current ($I_{RD10}$) is in a first relationship with the further reference current ($I_{10}$), when the selected PCM cell is in a further intermediate crystalline state, and the further read current ($I_{RD10}$) is in a second relationship with the further reference current ($I_{10}$) otherwise; and determining whether the selected PCM cell is in the further intermediate crystalline state, based on comparing the further read current ($I_{RD10}$) with the further reference current ($I_{10}$).

4. A method according to claim 3, wherein:
applying a further bias voltage ($V_{BL}$) to the selected bit line if a programming state of the selected PCM cell has not been determined yet, the further bias voltage ($V_{BL}$) being greater than any bias voltage ($V_{BL}, V_{00}, V_{01}, V_{10}$) previously applied to the selected bit line;
comparing a further read current, that flows through the selected bit line in response to applying the further bias voltage ($V_{BL}$), with a further reference current, wherein the further reference current is such that the further read current is in a first relationship with the further reference current, when the selected PCM cell is in a further intermediate crystalline state, and the further read current is in a second relationship with the further reference current otherwise; and
determining whether the selected PCM cell is in the further intermediate crystalline state, based on comparing the further read current with the further reference current;
are repeated until one of the following conditions is met:
determination has been made that the selected PCM cell is in one of the further intermediate crystalline states; and
determination has been made that the selected PCM cell is not in any of the further intermediate crystalline states.

5. A method according to claim 4, comprising determining that the selected PCM cell is in a set state if determination has been made that the selected PCM cell is not in any of the further intermediate crystalline states.

6. A method of claim 1 further comprising:
selecting a plurality of bit lines and a plurality of PCM cells, each connected to a respective one of the plurality of selected bit lines; and
deselecting each of the selected PCM cell for which an actual programming state has been determined.

7. A method of claim 4 further comprising sensing a device operating temperature ($T_C$); and adjusting the first bias voltage ($V_{00}$) based on the device operating temperature ($T_C$).

8. A method of claim 7 further comprises selecting the second bias voltage level and any further bias voltage level based on the device operating temperature.

9. A method of claim 1 comprising verifying a programming state of the selected PCM cell.

10. A method according to claim 9, wherein verifying comprises:
applying a verify bias voltage ($V_V$) to the selected PCM cell;
sensing a verify current ($I_V$), flowing through the selected PCM cell in response to the verify bias voltage ($V_V$); and
comparing the verify current ($I_V$) to a respective verify current range ($R_V$) including a respective current expected value ($I_{E00}, I_{E01}, I_{E10}, I_{E11}$).

11. A method according to claim 10, comprising re-programming read data (D), if the verify current ($I_V$) is outside the respective verify current range ($R_V$).

12. A phase change memory device comprising:
a plurality of PCM cells arranged in rows and columns and coupled to respective word lines and bit lines;
selecting circuits, for selecting a bit line and a PCM cell coupled to the selected bit line;
a bias circuit, for applying a first bias voltage ($V_{BL}, V_{00}$) to the selected bit line;
a sense circuit, for comparing a first read current ($I_{RD00}$), that flows through the selected bit line in response to the first bias voltage ($V_{BL}, V_{00}$), with a first reference current ($I_{00}$), wherein the first reference current ($I_{00}$) is such that the first read current ($I_{RD00}$) is in a first relationship with the first reference current ($I_{00}$), when the selected PCM is in a reset state, and the first read current ($I_{RD00}$) is in a second relationship with the first reference current ($I_{00}$) otherwise, wherein the sense circuit is operable to determine whether the selected PCM cell is in the reset state, based on comparing the first read current ($I_{RD00}$) with the first reference current ($I_{00}$);
characterized in that the bias is operable to apply a second bias voltage ($V_{BL}, V_{01}$) to the selected bit line if the selected PCM cell is not in the reset state, the second bias voltage ($V_{BL}, V_{01}$) being greater than the first bias voltage ($V_{BL}, V_{00}$).

13. A phase change memory according to claim 12, wherein the bias circuit includes:
a voltage regulating element, for selectively coupling with selected bit line through the selecting circuits; and
a voltage control circuit, for driving the voltage regulating element, so that one of a plurality of bias voltages ($V_{BL}$), including the first bias voltage ($V_{BL}, V_{00}$), is applied to the corresponding bit line.

14. A phase change memory according to claim 12 wherein the sense circuit comprises:
a reference module, for selectively supplying one of a plurality of reference currents ($I_{REF}$), including the first reference current ($I_{00}$); and
a sense amplifier for selectively coupling with selected bit line through the selecting circuits and operable to sense read currents ($I_{RD}$) flowing through the selected bit line, the read currents ($I_{RD}$) including the first read current ($I_{RD00}$).

15. A phase change memory according claim 12 wherein:
the sense circuit has an output coupled to a deselect input of the bias circuit, for providing a data recognition signal (DREC) in response to at least the first read current ($I_{RD00}$) being in a first relationship with the first reference current ($I_{00}$); and
the bias is operable to deselect the selected bit line in response to the data recognition signal (DREC).

16. A phase change memory device according to claim 12 further compriing, comprising a temperature sensor for supplying a temperature signal ($T_C$), an operative temperature of the phase change memory device.

17. A phase change memory device according to claim 16, wherein the bias circuit is coupled to the temperature sensor and is operable to adjust the first bias voltage ($V_{BL}, V_{00}$) based on the temperature signal ($T_C$).

18. A system comprising:
a control unit; and
a phase-change memory device (1) according to claim 12, coupled to said processing unit.

* * * * *